United States Patent [19]

Xu et al.

[11] Patent Number: 5,394,130
[45] Date of Patent: Feb. 28, 1995

[54] PERSISTENT SUPERCONDUCTING SWITCH FOR CONDUCTION-COOLED SUPERCONDUCTING MAGNET

[75] Inventors: Bu-Xin Xu, Florence, S.C.; Raghavan Jayakumar, Arlington, Tex.; John J. Wollan, Golden, Colo.

[73] Assignee: General Electric Company, Milwaukee, Wis.

[21] Appl. No.: 1,692

[22] Filed: Jan. 7, 1993

[51] Int. Cl.⁶ .................... H01F 1/00; H01F 7/06; H01H 47/00
[52] U.S. Cl. .................... 335/216; 505/879; 336/DIG. 1; 361/141
[58] Field of Search ............ 335/216; 505/1, 704, 505/705, 879; 336/DIG. 1; 361/141

[56] References Cited

U.S. PATENT DOCUMENTS

| | | | |
|---|---|---|---|
| 3,643,002 | 2/1972 | Minnich | 174/15 |
| 3,661,639 | 5/1972 | Caslaw | 117/213 |
| 3,728,165 | 4/1973 | Howlett | 335/216 |
| 4,586,017 | 4/1986 | Laskaris | 338/325 |
| 5,047,741 | 9/1991 | Laskaris | 335/216 |
| 5,093,645 | 3/1992 | Dorri | 335/216 |
| 5,194,810 | 3/1993 | Breneman | 324/319 |
| 5,204,650 | 4/1993 | Nemoto | 335/216 |

FOREIGN PATENT DOCUMENTS

| | | | |
|---|---|---|---|
| 59-88882 | 5/1984 | Japan | 335/216 |
| 218783 | 12/1984 | Japan | 335/216 |
| 0199407 | 8/1989 | Japan | 335/216 |

*Primary Examiner*—Leo P. Picard
*Assistant Examiner*—Stephen T. Ryan
*Attorney, Agent, or Firm*—Irving M. Freedman; John H. Pilarski

[57] ABSTRACT

A stable superconducting switch suitable for use in a conduction-cooled superconducting magnet includes a tape wound in a coil with the tape including an $Nb_3Sn$ conductor sandwiched between stabilizing layers of copper, bronze or brass and wound in layers, with groups of layers separated by a partial layer of electrically conductive material.

16 Claims, 2 Drawing Sheets

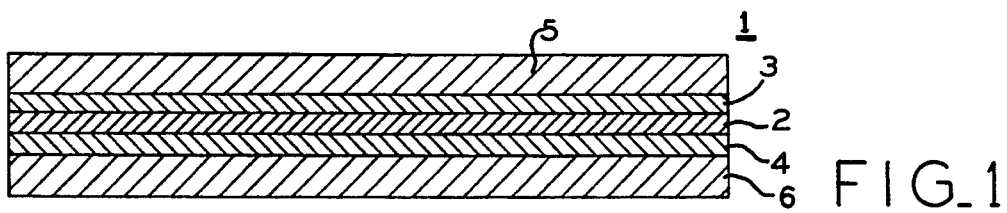
FIG_1
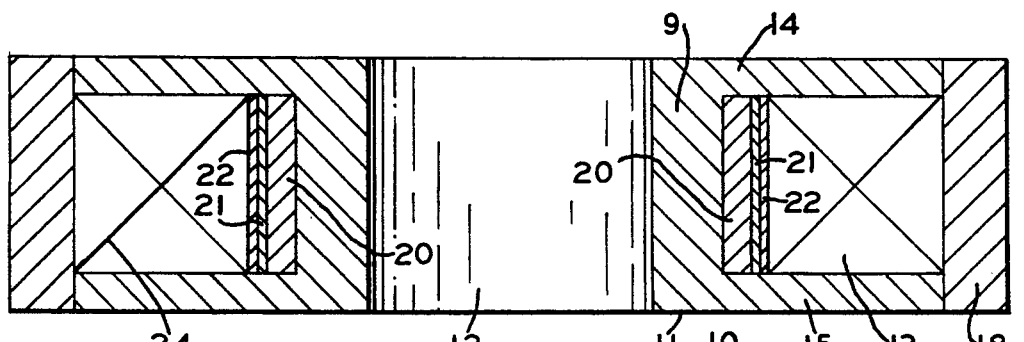
FIG_2
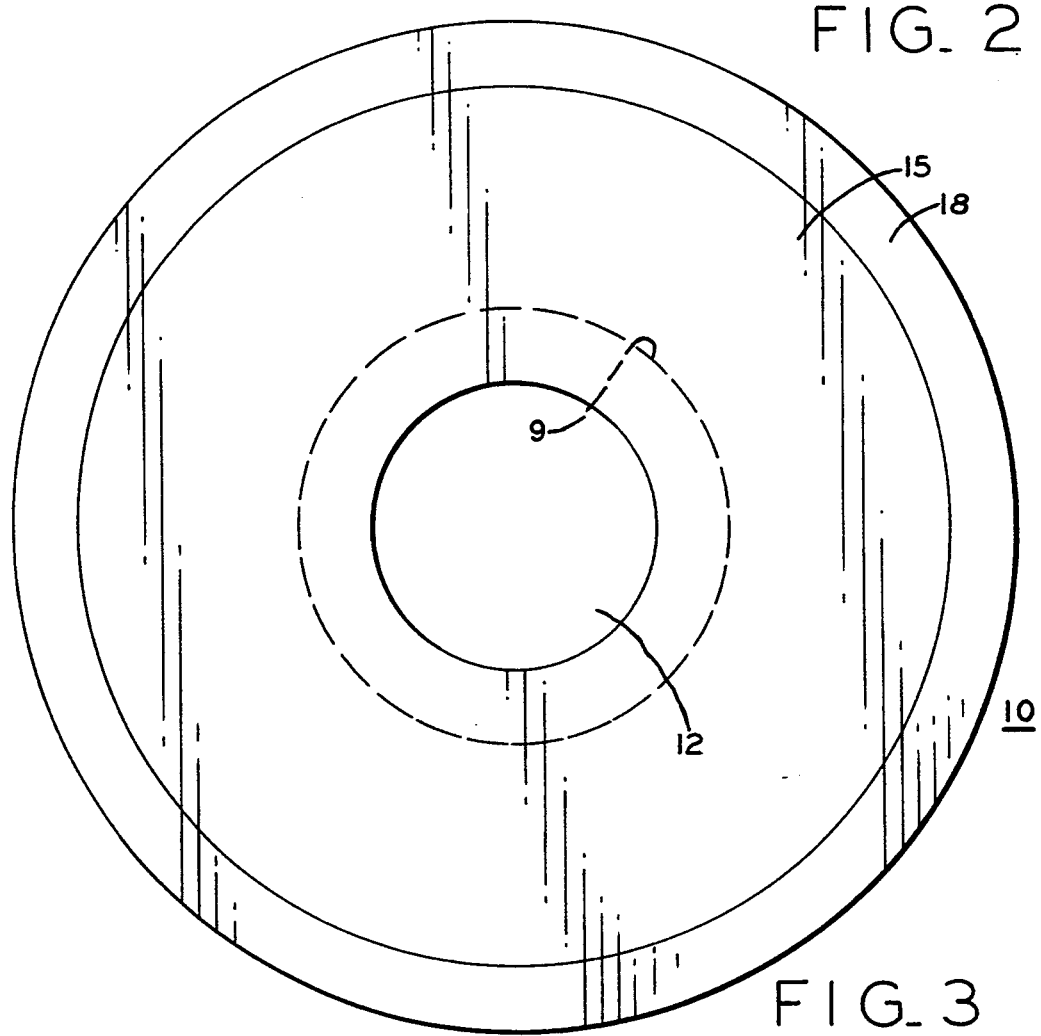
FIG_3

PERSISTENT SUPERCONDUCTING SWITCH FOR CONDUCTION-COOLED SUPERCONDUCTING MAGNET

BACKGROUND OF INVENTION

This invention relates to a persistent superconducting switch for use with conduction-cooled and liquid cryogen boiling-cooled superconducting magnets. Superconducting magnets find wide application, for example, in the field of magnetic resonance imaging (hereinafter called "MRI").

As is well known, a magnet can be made superconducting by placing it in an extremely cold environment, such as by enclosing it in a cryostat or pressure vessel containing liquid helium or other cryogen. The extreme cold reduces the resistance in the magnet coils to negligible levels, such that after a power source is initially connected to the coil to introduce a current flow into the coils, is removed the current will continue to flow through the coils due to the negligible resistance, thereby maintaining a magnetic field.

To maintain current flow in the magnet coils after removal of power it is necessary to complete the electric circuit within the cryogenic environment with a superconducting switch which is connected in parallel with the power supply and the magnet coils. The superconducting switch consists of a superconducting conductor which when driven into the non-superconducting or normal state has sufficient resistance so that current from the power supply will essentially all flow through the magnet coils during "ramp-up." When the desired magnetic field current is achieved the switch is returned to its superconducting state, and the magnet current commutates out of the power supply and through the switch when the power supply is ramped down. The magnet is now in "persistent mode".

There are four key characteristics that a superconducting switch must exhibit. One, it must be capable of easily and quickly being transformed (switched) from the superconducting state to the normal state and vice versa. There are three ways to do that: a) thermally—by heating the superconducting material above its transition temperature; b) magnetically—by applying a magnetic field greater than the critical field of the material; or c) electrically—by raising the current in the material above its critical current. The thermal method is the most common. Two, it must have a high enough resistance in its normal state such that current flow through the switch during ramp is negligible so that excessive heating in the cryogen environment is not produced. Three, the switch must be stable. That is, it must not transition from the superconducting to normal state; and it cannot burn out if it does. Four, it must be capable of carrying the same high currents as the magnet coils. One of the challenges in designing a superconducting switch is to balance the conflicting requirements of stability against high normal resistance and low heat input.

Most superconducting magnets, and superconducting switches if incorporated, have utilized NbTi as the superconducting material and have been cooled by direct contact with a boiling bath of flowing liquid helium (~4.2K). While the use of liquid helium to provide cryogenic temperatures has been widely practiced and is satisfactory, helium is found and is commercially obtained only in the state of Texas. As a result, providing a steady supply of liquid helium to superconducting magnet installations all over the world, particularly MRI systems, has proved to be difficult and costly. Consequently, considerable research and development effort has been directed at eliminating the need for a boiling cryogen such as liquid helium by developing superconducting materials and magnets which are superconducting at relatively higher temperatures such as 10 degrees Kelvin (10K). Such materials could then be cooled by conduction through the use of standard, commercial two-stage cryocoolers which alternately compress and expand gaseous helium in a closed system to remove heat from a given area. $Nb_3Sn$ and other higher temperature superconducting materials (such as YBCO) can be made superconducting at such relatively high temperatures.

However, the use of $Nb_3Sn$ in superconducting magnet applications has been limited to very high field applications, beyond the capability of NbTi. This has been mainly due to the fact that it is a brittle material. However, in addition to the ability of $Nb_3Sn$ to generate higher magnetic fields than NbTi, it also remains superconducting at higher temperatures $\{Tc(Nb_3Sn) = \sim 18K; Tc (NbTi) = \sim 9K\}$.

All superconductors must incorporate stabilizing material to provide an alternate path for current flow in case of a fault condition in which the superconducting material quenches; that is, reverts from its essentially non-resistive state to its "normal" or resistive state. Because $Nb_3Sn$ is brittle, stabilizing materials, particularly high resistance materials (e.g., brass) required for a switch, can subject $Nb_3Sn$ to severe compressional strains due to differences in thermal contraction which can severely degrade its performance (critical current). Those strains result from both cool down to room temperature from the fabrication temperature and subsequent cool down from ambient to the superconducting operating temperature of less than 18K. That is, the ability of $Nb_3Sn$ to carry superconducting currents is strongly dependent on any strain to which it is subjected. As a result, thermal strains should be avoided.

The $Nb_3Sn$ and stabilizing material can be assembled into a composite conductor in two forms—one is multi-filaments of $Nb_3Sn$ in a wire-formed stabilizer; the other is a $Nb_3Sn$ tape (typically less than 0.1 mm thick) with stabilizer bonded (soldered) to both sides. However, tape conductors are especially vulnerable to a phenomenon called flux jumping. This is a quick motion of the magnet flux penetrating a superconductor which generates local heating that may be sufficient to cause a quench. The incorporation of stabilizer in the conductor, in addition to providing an alternate current path when a superconductor quenches, can also reduce flux jumping and limits temperature excursions if it does occur, thereby preventing a quench. However, stabilizing materials for a superconducting switch must have relatively high electrical resistance, but the poor thermal conductivity associated with that high resistivity does not provide effective stabilization against flux jumps.

Flux jumping has been described as a kind of electromagnetic thermal instability affecting all high-field superconductors. Flux jumping or heating from other sources when current is flowing through a superconducting switch must be minimized to avoid quenching and, therefore, discontinuance of superconducting magnet operation. For a standard helium pool—boiled, cooled magnet, for example and an MRI system, a quench of the superconducting magnet causes a major disruption of equipment use because it results in a shut down and requires a time-consuming and expensive (if replenishment of the liquid helium cryogen is required) subsequent ramping up of the superconducting magnet. Heating is a particularly difficult problem in a conduction-controlled superconducting switch, because of the limited cooling capacity as compared with the use of a boiling cryogen such as liquid helium.

Thus, there are a number of conflicting characteristics and properties required of material and structure for stable superconducting switches. The problem of differential expansion of materials, or thermal contraction, is of particular concern and must be overcome in a stabilizer which is laminated together with the superconductor in an oven at temperatures around 600K, but in operation is cooled to, and operated in, the range of 4–10K. The thermal contraction rate of the stabilizer should be as close to the superconductor as possible in order to minimize the thermal stress to the superconductor, and the stabilizer should have good thermal conductivity to conduct heat away from the superconductor which is generated because of current flow and flux motion in the superconductor. In addition, with the high currents existing during superconductivity, within the requirements which will satisfy the superconducting magnet ramp-up rate and size, the electrical conductivity of the stabilizer should be chosen as large as possible to further increase superconductor stability.

Various approaches to resisting flux jumping have involved slowing down the motion of the magnetic flux, and improving the cooling of the superconducting magnet. Other approaches have involved interleaving copper foils between the tape conductor and exposing the edges of the superconducting coil stack to boiling liquid helium. They have not proven to be completely satisfactory in meeting the overlapping and conflicting requirements which must be satisfied for a practical and satisfactory superconducting switch.

OBJECTS AND SUMMARY OF INVENTION

It is an object of the present invention to provide an improved stable superconducting switch utilizing $Nb_3Sn$ conductor and which is suitable for use with a superconducting magnet.

It is another object of the present invention to provide an improved $Nb_3Sn$ superconducting switch suitable for use with a superconducting magnet which will withstand the magnetic, electrical and thermal forces encountered during magnet ramp up operation.

It is yet another object of the present invention to provide an improved superconducting switch suitable for use with a conduction cooled superconducting magnet, and one which minimizes the heat generation during operation.

Still another object of the present invention is to provide an improved $Nb_3Sn$ superconducting switch which is stabilized against flux-jumping and is suitable for use with a conduction cooled superconducting magnet.

In accordance with one form of the invention, a superconducting switch for use in a superconducting magnet, including conduction-cooled superconducting magnets, is wound in layers on a coil form and positioned adjacent the superconducting magnet. The superconducting switch utilizes $Nb_3Sn$ tape conductor sandwiched between metallic stabilizing layers selected from the group consisting of bronze, brass, and copper (copper nickel or pure copper). In one embodiment, the layers of copper in intimate contact with the $Nb_3Sn$ conductor are in turn sandwiched between layers of stainless steel in intimate contact with the copper. The bronze and brass layers are 0.75 millimeter (mm) thick, while the copper and stainless steel layers are 0.025 mm thick. The superconductor tape is wound in a bi-filar winding on a fiberglass bobbin with groups of layers separated by an electrically conducting perforated copper sheet. The superconductor tape thus formed is approximately three millimeters wide and is wound into ten groups of six layers each, separated by insulating glass and a copper sheet which does not overlap itself. A magnetic shield is provided in one embodiment of the invention.

BRIEF DESCRIPTION OF INVENTION

FIG. 1 is a cross sectional view of the superconductor tape of the present invention.

FIG. 2 is a cross-sectional side view of the assembled superconducting switch on a bobbin.

FIG. 3 is a top view of the superconducting switch of FIG. 2.

Figure 4:
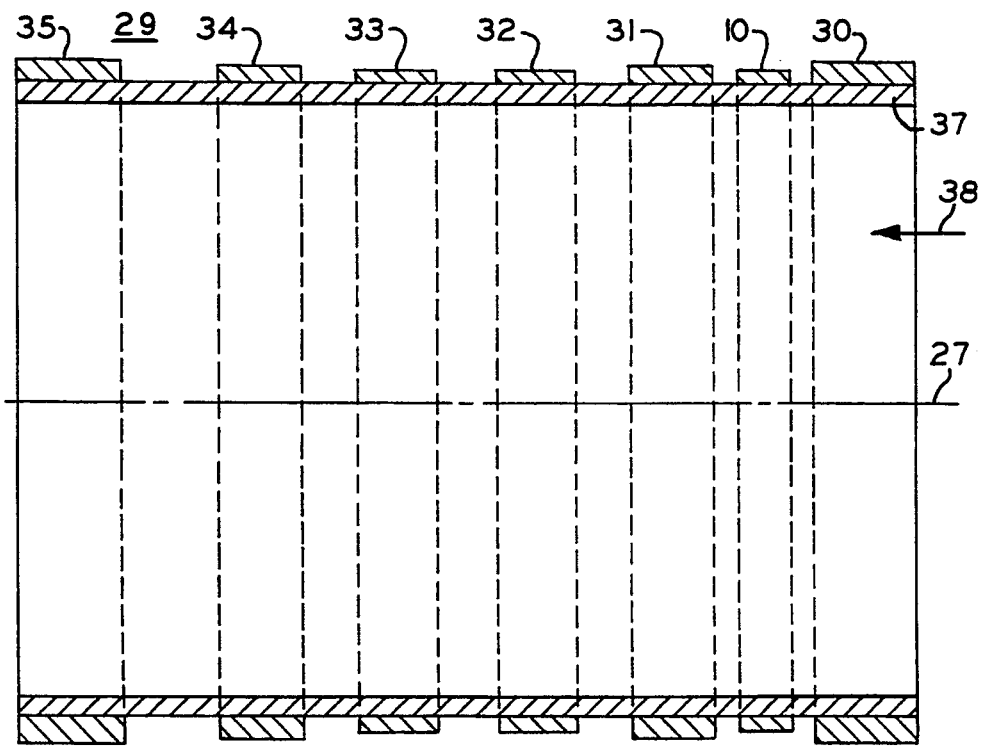
FIG. 4 is a side view of an alternate embodiment of the invention.

Referring first to FIG. 1, the superconductor tape in a preferred embodiment includes a superconductor 2 of $Nb_3Sn$ approximately three millimeters wide. Laminated to opposite sides of superconductor 2 are layers 3 and 4, which are either bronze or brass 0.075 mm thick or copper 0.025 mm thick. The lamination may be accomplished in an oven at a temperature of about 600K, or in a solder bath.

Stainless steel layers, 5 and 6 then laminated on the outside of the assembly if copper for layers 3 and 4 is used. Copper layers 3 and 4 have very high thermal conductivity, while stainless steel layers 5 and 6 have relatively large specific heat at low temperatures. This combination has proven to provide very good thermal performance over the wide temperature range to which superconductor tape 1 is subjected during operation. In this tape configuration, the mechanical property of superconductor composite tape i is dominated by the stainless steel, which provides good thermal contraction characteristics because it is well matched with the thermal coefficient of expansion of $Nb_3Sn$ superconductor 2. The stainless steel-copper composite sandwich provides a mechanically strong assembly which exhibits high thermal conductivity with high specific heat stabilization to provide a stable, easily handled superconductor tape assembly.

Referring next to FIGS. 2 and 3. Superconducting switch 10 includes bobbin 11 with central aperture 12 formed by annulus 9, and includes radially extending walls 14 and 15 which form annular cavity 13 within which superconductor tape 1 is wound into a coil. The width of superconducting switch 10 shown in FIGS. 2 and 3 is 1.75 inches.

Superconductor tape 1 is 3.1 millimeters wide and is bifilar wound within cavity 13 on annulus 9 between walls 14 and 15 into a multi-layer coil. The first layer 20 is surrounded by one layer of 0.25 millimeter thick perforated copper sheet 21 without electrical closure; that is, the partial wrap of perforated copper does not overlap itself. Fiberglass layer 21 0.05 millimeters thick is then wound around perforated copper sheet 21, winding of superconductor tape 1 is continued and additional groups of layers, such as 20 and 21, which groups are added until there are ten groups of six layers 20 of superconductor tape 1 for a total of sixty layers, each group surrounded by a layer of fiberglass 21 and perforated copper layer 22. The width in the axial direction of each layer is 31 millimeters.

The axial length of MRI superconducting magnet assembly 29 is approximately 1350 millimeters, while the inside diameter of the main magnet coils 30-35 is approximately 580 millimeters. The current flows in bi-filar windings 20 of superconducting switch 10 cancel each other and do not contribute to the main magnet field provided by main magnet coils 30-35.

If the cancellation of the magnetic field of superconducting switch 10 is not fully complete, any residual field can be shimmed by shimming magnet coils or passive (iron) shims (not shown).

The reduced magnetic field inside superconducting switch 10 also increases the critical current of superconductor tape 1 and therefore reduces the ratio $I_t/I_c$ where $I_t$ is the transport current, and $I_c$ is the critical current of the superconducting switch. The reduction of the ratio $I_t/I_c$ results in a large increase of the self-field stability parameter $\beta_t$. Moreover, because the magnetic force on superconducting switch 10 is expressed by the relationship $F=B \times I_t$, a reduced magnetic field inside superconducting switch 10 reduces the magnetic forces on the superconducting switch. A copper ring 18 could be used to enclose the assembly and to conduct heat.

The placement of an alternate embodiment Superconducting switch 10 within a superconducting magnet assembly, such as an MRI, is shown in FIG. 4. Referring to FIG. 4, superconducting switch 10 is positioned between main magnet coils 30 and 31 of MRI superconducting magnet assembly 29. Superconducting magnet assembly 29 includes six main magnet coils 30, 31, 32, 33, 34 and 35 spaced along axis 27 of the superconducting magnet 29 with, in one MRI configuration, main magnet coils 39 and 35 being wider than main magnet coils 31 and 34, which in turn are wider in the axial direction than main magnet coils 32 and 33.

As shown in FIG. 4, main coil magnets 30-35 and superconducting switch 10 are mounted on sleeve 37 of the cryocooler for MRI superconducting magnet assembly 29. Sleeve 37 is a hollow cylindrical member. Suitable conduction cooling is provided and is indicated by arrow 38.

The embodiment of the invention described above utilizing bronze or brass stabilizing layers 3, 4 provides a high resistance, small mass superconducting persistent switch 10 with a relatively large inductance, typically 50-100 H or more. The embodiment of the invention, utilizing copper stabilizing layers 3, 4 provides a low resistance, small mass superconducting magnet with relatively small inductance, typically less than 50 H. A typical resistance of superconducting switch 10 is twenty ohms at 10K temperature, with only 0.5 watts input energy from the power supply when MRI superconducting magnet assembly 29 is being ramped up at the rate of one T per hour. Such superconducting switches exhibit a recovery time after quench of less than twelve minutes.

Figure 5:
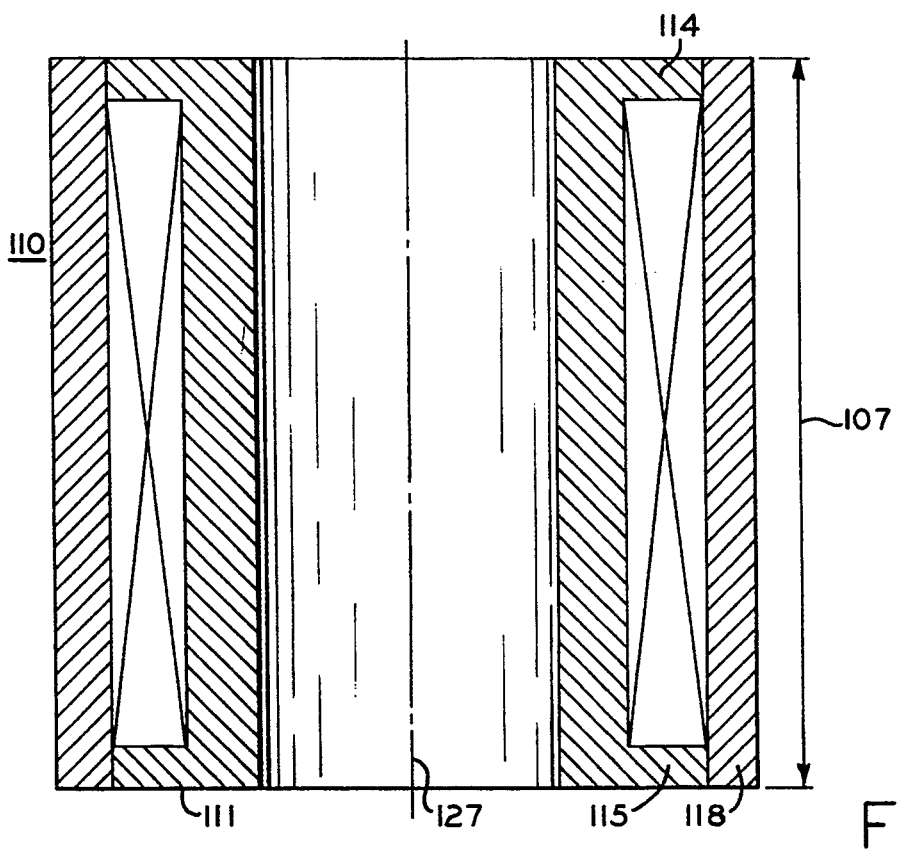
FIG. 5 is a cross sectional view of an alternate embodiment of the invention.

A low resistance, small mass superconducting switch 10 utilizing stainless steel-copper composite or pure copper as its conductor stabilizer is shown in FIG. 5. Referring to FIG. 5, fiberglass bobbin 111 of superconducting switch 110 extends a substantially greater distance in the axial direction along axis 127, in the order of three times the axial length 107 of superconducting switch 10 of FIGS. 3 and 4. The increased overall length 107 provides an increased length of copper stabilizing layers 3 and 4 of superconductor 2 (see FIG. 1) to provide a high thermal conductivity to stabilize superconducting switch 110.

In operation superconductor tape 1 absorbs large amounts of energy during the initial period of magnet ramp-up, with the small mass of the superconducting switch 10 allowing the temperature to rise quickly in order to increase its electrical resistance. The increase of electrical resistance then reduces the energy absorption of the switch.

The present invention has proved to provide a stable persistent superconducting switch for superconducting magnets utilizing the desirable characteristics of $Nb_3Sn$ yet practical for fabrication, suitable for use with conduction cooling to eliminate the need for boiling helium, which resists flux jumping and which can withstand extreme electromagnetic and thermal forces and loading, while providing the necessary electrical, magnetic and structural characteristics. Depending on the stabilizer selected a small mass switch can be fabricated to provide either high resistance, high inductance or low resistance, low inductance, providing greater flexibility in superconducting magnet design.

While the present invention has been described with respect to certain preferred embodiments thereof, it is to be understood that numerous variations in the details of construction, the arrangement and combination of parts, and the type and configuration of materials used may be made without departing from the spirit and scope of the invention.

What we claim is:

1. A superconducting switch stabilized against flux-jumping in a conduction-cooled superconducting magnet assembly including main magnet coils, said superconducting switch comprising;

a coil form;
a superconducting tape wound in layers on said coil form;
said coil form positioned adjacent to said main magnet coils of said superconducting magnet assembly;
said superconducting tape including $Nb_3Sn$ conductor with metallic stabilizing layers on opposite sides of said $Nb_3Sn$ conductor;
the provision of conduction cooling to said superconducting magnet assembly and said superconducting switch for superconducting operation;
wherein said metallic layers are selected from the group consisting of bronze or brass and copper
whereby the selection of bronze or brass is utilized to provide a superconducting switch with a higher resistance and higher inductance than the selection of copper and whereby said superconducting switch resists flux jumping; and
wherein partial layers of an electrically conducting material without electrical closure separate groups of layers of said superconductor tape.

2. The stabilized superconducting switch of claim 1 wherein said electrically conducting material is perforated copper sheet.

3. The stabilized superconducting switch of claim 2 wherein each of said group of layers of superconductor tape is on the order of six layers thick.

4. The stabilized superconducting switch of claim 3 wherein there are on the order of sixty layers of superconductor tape, and on the order of ten layers of conducting material.

5. A superconducting magnet assembly including a superconducting switch and superconducting main magnet coils comprising:
a plurality of said main magnet coils of different axial widths and similar diameters;
a superconducting switch stabilized against flux-jumping including a coil positioned between the main magnet coil having the greatest axial width and its adjacent main magnet coil and further comprising;
a coil form;
a superconducting tape of $Nb_3Sn$ sandwiched between stabilizing layers wound in layers on said coil form;
said coil form positioned adjacent to said superconducting magnet;
said superconducting switch and said superconducting magnet being of substantially the same diameter; and
the provision of conduction cooling to said superconducting magnet assembly for superconducting operation;
whereby said superconducting switch resists flux-jumping.

6. The stabilized superconducting switch of claim 5 wherein said stabilizing layers include a layer of copper sandwiched and in intimate contact with said $Nb_3Sn$ conductor, and a layer of stainless steel sandwiched and in intimate contact with each layer of copper on the surfaces of said copper remote from said $Nb_3Sn$ conductor, said stainless steel being approximately 0.025 mm thick.

7. A superconducting magnet assembly comprising:
a plurality of magnet coils of different axial widths and similar diameters;
a superconducting switch stabilized against flux-jumping including a coil mounted between the widest magnet coil and its adjacent magnet coil and further comprising;
a coil form;
a superconducting tape of $Nb_3Sn$ sandwiched between stabilizing layers wound in layers on said coil form;
said coil form positioned adjacent to said superconducting magnet;
said superconducting switch and said superconducting magnet being of substantially the same diameter; and
the provision of conduction cooling to said superconducting magnet assembly for superconducting operation;
whereby said superconducting switch resists flux-jumping; and
wherein the superconductor tape is wound in a bifilar winding.

8. The stabilized superconducting switch of claim 7 wherein partial layers of an electrically conducting material without electrical closure separate groups of layers of said superconductor tape.

9. The stabilized superconducting switch of claim 8 wherein said electrically conducting material is perforated copper sheet.

10. The stabilized superconducting switch of claim 9 wherein each of said group-of layers of superconductor tape is on the order of six layers thick.

11. The stabilized superconducting switch of claim 10 wherein there are on the order of sixty layers of superconductor tape, and on the order of ten layers of conducting material.

12. A superconducting magnet assembly comprising:
a plurality of magnet coils of different axial widths and similar diameters;
a superconducting switch stabilized against flux-jumping including a coil mounted between the widest magnet, coil and its adjacent magnet coil and further comprising;
a coil form;
a superconducting tape of $Nb_3Sn$ sandwiched between stabilizing layers wound in layers on said coil form:
said coil form positioned adjacent to said superconducting magnet;
said superconducting switch and said superconducting magnet being of substantially the same diameter; and
the provision of conduction cooling to said superconducting magnet assembly for superconducting operation:
whereby said superconducting switch resist flux-jumping; and
wherein said stabilizing layers of said superconducting tape are selected from the group consisting of bronze or brass, approximately 0.075 mm thick; and copper approximately 0.025 mm thick.

13. The stabilized superconducting switch of claim 12 wherein said coil form is a fiberglass bobbin and said bronze or brass stabilizing layers provide a high resistance, small mass, relatively large inductance persistent switch, and said copper stabilizing layer provide a low resistance small mass relatively small inductance persistent switch.

14. The stabilized superconducting switch of claim 13 wherein conduction cooling is provided for said superconducting magnet assembly to maintain superconducting operation.

15. A superconducting magnet assembly comprising:
a plurality of magnet coils of different axial widths and similar diameters;
a superconducting switch stabilized against flux-jumping including a coil mounted between the widest magnet coil and its adjacent magnet coil and further comprising;
a coil form;
a superconducting tape of $Nb_3Sn$ sandwiched between stabilizing layers wound in layers on said coil form;
said coil form positioned adjacent to said superconducting magnet;
said superconducting switch and said superconducting magnet being of substantially the same diameter; and
the provision of conduction cooling to said superconducting magnet assembly for superconducting operation;
whereby said superconducting switch resists flux-jumping; and
wherein said stabilizing layers of said superconducting tape are copper providing a low resistance, small mass superconducting switch with an inductance of less than 50 H.

16. A superconducting magnet assembly comprising:
a plurality of magnet coils of different axial widths and similar diameters;

a superconducting switch Stabilized against flux-jumping including a coil mounted between the widest magnet coil and its adjacent magnet coil and further comprising:

a coil form;

a superconducting tape of $Nb_3Sn$ sandwiched between stabilizing layers wound in layers on said coil form;

said coil form positioned adjacent to said superconducting magnet;

said superconducting switch and said superconducting magnet being of substantially the same diameter; and the provision of conduction cooling to said superconducting magnet assembly for superconducting operation;

whereby said superconducting switch resists flux-jumping; and wherein said stabilizing layers of said superconducting tape are selected from the group consisting of bronze and brass to provide a high resistance, small mass, superconducting switch.

* * * * *